(12) United States Patent
Scofet et al.

(10) Patent No.: US 7,668,215 B2
(45) Date of Patent: Feb. 23, 2010

(54) APPARATUS FOR DISSIPATING HEAT IN ELECTRO-OPTICAL COMMUNICATIONS SYSTEMS

(75) Inventors: Marco Scofet, Rivarolo C.se (IT);
Enrico Di Mascio, Sulmona (IT);
Cristiana Contardi, Turin (IT); Stefano Genisio, Pratiglione (IT)

(73) Assignee: Avago Technologies Fiber IP (Singapore) Pte. Ltd., Singapore (SG)

( * ) Notice: Subject to any disclaimer, the term of this patent is extended or adjusted under 35 U.S.C. 154(b) by 875 days.

(21) Appl. No.: 10/938,853

(22) Filed: Sep. 13, 2004

(65) Prior Publication Data
US 2005/0094688 A1  May 5, 2005

(30) Foreign Application Priority Data
Sep. 11, 2003  (GB)  ................... 0321265.1

(51) Int. Cl.
*H01S 3/04* (2006.01)

(52) U.S. Cl. ................... 372/36; 372/34; 257/675; 257/706; 257/796

(58) Field of Classification Search .................. 372/36; 257/675, 706, 796
See application file for complete search history.

(56) References Cited

U.S. PATENT DOCUMENTS

| 4,912,715 A | 3/1990 | Aoki et al. |
| 7,254,149 B2 * | 8/2007 | Giaretta et al. ................ 372/36 |
| 2002/0136250 A1 | 9/2002 | Roelig et al. |

FOREIGN PATENT DOCUMENTS

| EP | 1 079 480 | 8/2001 |
| WO | 03/026084 | 3/2003 |

* cited by examiner

*Primary Examiner*—Minsun Harvey
*Assistant Examiner*—Tod T Van Roy

(57) ABSTRACT

A laser mounted in a casing is driven by and mounted close to its driving circuit. To reduce the effect on the laser of heat generated by the driver circuit, the casing includes a passive heat sink element on which the driver circuit is mounted whereby heat generated by the driver is dissipated by the passive heat sink element.

8 Claims, 1 Drawing Sheet

APPARATUS FOR DISSIPATING HEAT IN ELECTRO-OPTICAL COMMUNICATIONS SYSTEMS

RELATED APPLICATIONS

The present application is based on, and claims priority from, GB Patent Application Number 0321265.1, filed Sep. 11, 2003, the disclosure of which is hereby incorporated by reference herein in its entirety.

FIELD OF INVENTION

The present invention relates to techniques for dissipating heat in electro-optical communication systems.

More specifically, the present invention addresses a problem likely to arise e.g. in high bit rate transmitters for optical communications, including a laser source and an associated driver circuit usually comprised of an IC driver circuit.

BACKGROUND OF INVENTION

The laser source and the IC driver circuit are usually hosted in a package adapted to integrate electrical, mechanical and optical components having associated thermal aspects.

The sensitive RF-link between the IC driver and the laser requires a short connection between the two components. The region where the laser is located is however likely to have a relatively high temperature because of the close proximity of the laser to heat dissipated by the driver. The high laser temperature may adversely affect the laser transmission performance.

Active solutions, such as thermoelectric coolers (e.g. Peltier coolers) or high dissipating materials joined to the metal packages of the components are commonly used to palliate those problems.

These arrangements inevitably add much to the footprint size and cost of the laser/driver assembly. Also, active systems designed for ensuring proper dissipation of the thermal energy coupled to the laser from the associated driver circuit add considerably to the system power consumption.

The object of the present invention is to provide a new and improved arrangement for effectively facilitating heat dissipation in an arrangement including an electro-optical converter such as a laser diode and an associated driver circuit.

SUMMARY OF INVENTION

According to a first aspect of the invention, a driver circuit is mounted on a passive metal heat sink, which is spaced from a board on which the laser is mounted. Preferably, an external heat dissipator is associated with the heat sink to further improve cooling performance.

Another aspect of the invention relates to a combination including a laser mounted in a casing having an opening into which a heat sink is fitted. A driver circuit for the laser is carried by the heat sink so heat generated by the driver circuit is transferred to the heat sink by a thermal conduction path having a high thermal conductivity. The opening has a first surface on which a first surface of the heat sink is mounted. The opening has a wall arrangement spaced from and surrounding a wall arrangement of the heat sink. The spacing between the wall arrangements form a thermal barrier having a thermal conduction path with a low thermal conductivity.

Preferably, the casing includes an interior cavity into which the heat sink projects and the driver circuit is mounted on a portion of the driver circuit that is coupled to the cavity.

The heat sink, preferably further includes a stem and a base, wherein the stem includes a wall arrangement of the heat sink, while the base includes the lot surface of the heat sink.

The driver circuit is preferably mounted on a free end of the first stem at an end of the wall arrangement defining a first boundary portion of the cavity. Preferably, the casing includes a second surface that defines a second boundary portion of the cavity and surrounds the free end of the stem and circuitry for controlling the driver circuit as well as the laser mounted in the second surface. Preferably, the heat sink is, preferably a passive heat sink and the barrier consists of an air gap between the surfaces.

BRIEF DESCRIPTION OF THE DRAWINGS

The invention will now be described, by way of example only, with reference to the annexed figures of drawing, wherein.

DETAILED DESCRIPTION OF THE DRAWINGS

Figure 1:
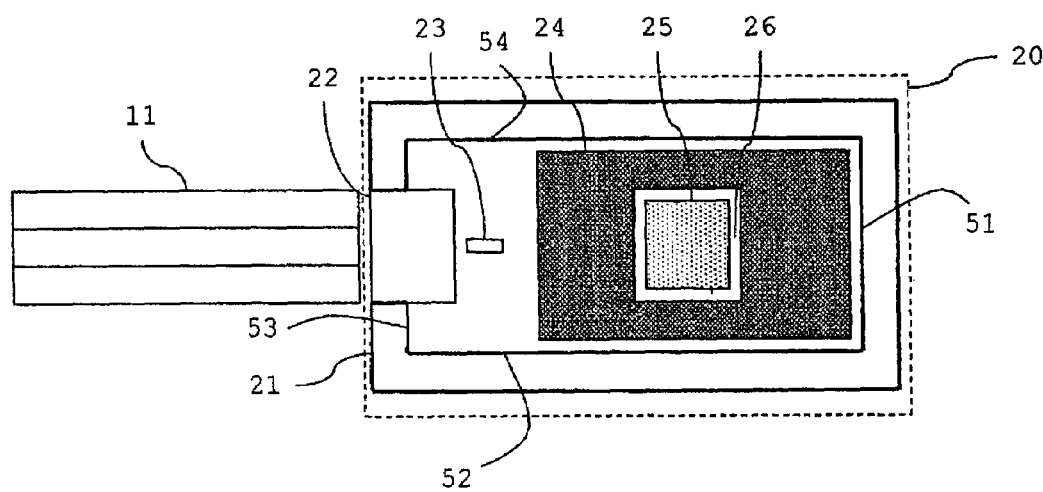
FIG. 1 is a top plan view of an optical transmitter module including the passive heat dissipation arrangement described herein.
Figure 2:
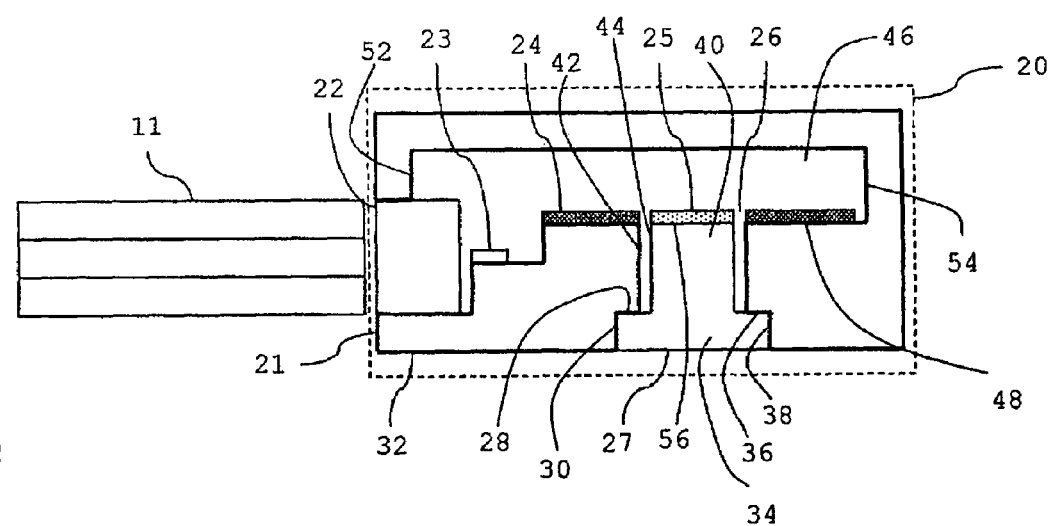
FIG. 2 is a corresponding schematic, partially sectional side view of the optical transmitter module of FIG. 1.

The figures of the annexed drawing include an optical transmitter module 20, e.g. for a 10 Gbit/s optical transceiver system. The overall structure of the module 20 corresponds to a known arrangement in the art, thus making it unnecessary to provide a more detailed description of module 20 herein.

The transmitter module 20 shown essentially includes:

(1) a full ceramic package 21 forming the casing that carries the transmitter module 20, (2) an electro-optical converter in the form of an optical source 23 (such as e.g. a laser diode) for generating optical radiation which is injected into an optical fiber 11 via an optical coupling system 22 (such as a lens system), and (3) an IC driver 25 with an associated integrated RF-DC circuit 24 of a known type for generating a bias current and a modulation current for the optical source 23, in order to switch the output of the source 23 "on" or "off". Circuit 24 consumes considerably less power and gives off much less heat than driver circuit 25, that circuit 24 surrounds.

The ceramic package 21 uses a multi-layer structure, allowing the use of inexpensive materials such as e.g. ceramic materials. Preferably, alumina is used, as this provides a thermal barrier between the optical source 23 and the driver 25, while also permitting integration of the complex circuit 24 with the same construction technology (e.g. no brazed or soldered ceramic parts into the metal body).

Additionally, circuit 24 is preferably a multi-layer structure to provide a better RF-DC connection design, integrated on several layers, in order to shrink the circuit 24 and therefore the size of the package (e.g. 6 mm width), while ensuring that the electrical connections correctly operate at e.g. 10 Gbit/s with impedance matched tracks connected between circuit 24 and driver 25 and between driver 25 and laser 23.

The optical system 22 can be realized by resorting to different optical solutions in order to match different performance requirements for different communication standards (e.g.: FC, SONET, ETHERNET, and so on).

The IC driver 25 generates most of the heat produced in the assembly shown, and heat dissipation is thus provided in order to counter inasmuch as possible propagation of heat from the driver 25 towards the optical source 23.

For that purpose the driver 25 is mounted on a passive heat sink 27. The heat sink 27 is attached to the package 21 of the transmitter e.g. by means of contact surfaces 28 and 30 of package 21. Surfaces 28 and 30 respectively extend parallel to and at right angles to base surface 32 of package 21. Heat sink 27 includes head 34 having surfaces 36 and 38 that correspond with and abut surfaces 28 and 30 when the heat sink is secured in place in the aperture of package 21 that extends through the package base surface 32. There are four surfaces 30 and four surfaces 38, such that each of surfaces 30 and 38 has four equal length walls that are at right angles to each other, i.e., have square cross sections in planes parallel to base surface 32, to provide precise fitting of heat sink 27 and driver 25 into the aperture of housing 21.

In the preferred embodiment shown, the heat sink is in the form of a shaped body of a heat conductive material such as CuW (copper-tungsten) or different Cu alloys. Other ceramic materials can be considered for that purpose, these alternative materials being however less preferred choices due to economical reasons.

More specifically, the exemplary embodiment of the passive heat sink 27 shown herein provides for the sink to include an inverted mushroom or T-shaped body having a stem portion 40 inserted into the opening provided in the base surface casing or package 21 and carrying the driver 25 mounted at the distal end of the stem portion.

The aperture in the package hosting the stem portion 40 of the heat sink 27 has walls 42 with larger transverse dimensions than walls 44 of stem portion 40 of the sink 27 that is inserted therein. This arrangement creates a further thermal isolation air gap 26 between the driver 25 and the optical source 23, as well as circuit 24. The air gap 26 has a low thermal conductivity compared to the thermal conductivity of heat sink 27 and ceramic package. In the planes parallel to base surface 32, there are four equal length walls 44 at right angles to each other, so that walls 42 and 44 have square cross sections in planes parallel to base surface 32.

With heat sink 27 in place in the aperture of casing or package 21 that extends through surface 32 an interior cavity 46 is provided in the casing. Cavity 46 includes a planar floor that extends parallel to base surface 32 and at right angles to planar walls 51-54 that are in planes at right angles to each other. The planar floor of cavity 46 includes modulation and bias circuit 24 that is (1) carried by interior planar surface 48 of casing 21; and (2) spaced from walls 5154 of the casing. Surface 48 extends parallel to base surface 32. The planar floor of cavity 46 also includes driver circuit 25, carried by the top planar face 56 of heat sink 27. The surface area of circuit 24 is considerably greater than that of circuit 25 in planes parallel to base surface 32 so that the area of circuit 25 that couples heat into cavity 46 is substantially less than the area of circuit 24 that couples heat into cavity 46. The performance of laser 23 is not adversely affected by the heat given off by driver 25 and/or circuit 24 because of, inter alia, (1) the thermal isolation between walls 42 and 44; (2) the high thermal conductivity of heat sink 27 between driver 25 and the exterior face of the heat sink that is exposed to ambient air surrounding (i) casing 21 or (ii) an additional external heat dissipater (not shown) that is in thermal contact with the heat sink exterior surface, (3) the location of circuit 24 completely around driver circuit 25, (4) the location of planar faces of the integrated circuits that form circuits 24 and 25 on the floor of cavity 46, (5) the space between (i) the edges of the integrated circuit that forms circuit 24 and each (ii) each of walls 51, 52 and 54, and (6) the low thermal conductivity of multi-layer ceramic package 21.

The cooling performance of the sink 27 associated with the driver 25 may be further enhanced by providing the previously mentioned additional external heat dissipator that (1) is mounted against the outer wall of the package or casing 21 and (2) contacts in a heat transfer relationship the head portion of the heat sink 27 in order to assist in transferring the heat generated by the driver 25 out of the transmitter module 20.

The gap 26 and the preferential heat conduction path out of the package 21 through the heat sink 27 reduce the heat transfer from the driver 25 towards the optical source 23.

The basic principles of the invention remaining the same, details and embodiments may widely vary with respect to what has been described and illustrated purely by way of example, without departing from the scope of the presented invention as defined in the annexed claims.

Also, terms such as "optical", "light", "photosensitive", and the like are used herein with the meaning currently allotted to those terms in fiber and integrated optics, being thus intended to apply to radiation including, in addition to visible light, e.g. also infrared and ultraviolet radiation.

The invention claimed is:

1. An arrangement including:
    a casing defining an interior cavity and having a base surface,
    an electro-optical converter, mounted in said casing,
    a driver circuit for driving said electro-optical converter, said driver circuit being mounted in the vicinity of said electro-optical converter, whereby heat generated by said driver circuit has a tendency to propagate towards said electro-optical converter, and
    a heat sink element in said casing, said heat sink mounting said driver circuit for causing heat generated by said driver to be essentially dissipated by said heat sink element,
    wherein said casing has an opening formed in the base surface for receiving said heat sink element, wherein said opening formed in said casing base surface has a peripheral wall,
    wherein said heat sink has an inverted mushroom-like or T shape with a stem portion and a head portion, wherein said driver circuit is mounted at the distal end of said stem portion,
    wherein said heat sink is arranged in said opening in such a way that said stem portion of said heat sink is inserted in said opening and a thermal isolation air gap is formed between said peripheral wall and said heat sink element, and wherein the driver circuit mounted at the distal end of said stem portion is exposed to the interior cavity but the heat sink is not exposed to the interior cavity, and
    wherein the casing wall is configured as a multi-layer structure that defines the interior cavity into a first interior cavity portion and a second interior cavity portion and provides a thermal barrier therebetween, wherein the driver circuit is in the first interior cavity portion, and wherein the electro-optical converter is in the second interior cavity portion.

2. The arrangement of claim 1, wherein said electro-optical converter includes a laser.

3. The arrangement of claim 1, wherein said casing is made of a heat-insulating material.

4. The arrangement of claim 1, wherein said casing is made of a ceramic material.

5. The arrangement of any of claim 1, wherein said casing is made of alumina.

6. The arrangement of claim 1, wherein said heat sink element includes material selected from the group consisting of CuW (copper-tungsten), Cu alloys, and ceramic materials.

7. The arrangement of claim 1, further including an external heat dissipator is mounted on the outer surface of said casing in a heat transmission relationship to said heat sink element.

8. The arrangement of claim 1, wherein said electro-optical converter is mounted on a board in said casing and said heat sink is spaced from the board on which said electro-optical converter is mounted.

* * * * *